(12) United States Patent
Fraley

(10) Patent No.: US 10,224,890 B1
(45) Date of Patent: Mar. 5, 2019

(54) APPLICATION CONTROLLED VARIABLE AUDIO EAR PLUGS

(71) Applicant: SPRINT COMMUNICATIONS COMPANY, L.P., Overland Park, KS (US)

(72) Inventor: William Julius Fraley, Leawood, KS (US)

(73) Assignee: Sprint Communications Company L.P., Overland Park, KS (US)

( * ) Notice: Subject to any disclaimer, the term of this patent is extended or adjusted under 35 U.S.C. 154(b) by 122 days.

(21) Appl. No.: 14/197,902

(22) Filed: Mar. 5, 2014

(51) Int. Cl.
 *H03G 3/32* (2006.01)
 *H03G 3/24* (2006.01)
 *H03G 5/02* (2006.01)

(52) U.S. Cl.
 CPC .............. *H03G 3/24* (2013.01); *H03G 5/025* (2013.01)

(58) Field of Classification Search
 CPC .......... H03G 5/165; H03G 5/025; H03G 3/24; H04R 1/1041; H04R 1/1016; H04R 1/10; H04R 1/1083; H04R 1/105; H04R 5/04; H04M 1/6058; H04M 1/05
 USPC ................. 381/56, 57, 58, 74, 103, 309, 104
 See application file for complete search history.

(56) References Cited

U.S. PATENT DOCUMENTS

| | | | | |
|---|---|---|---|---|
| 7,872,574 | B2 * | 1/2011 | Betts | G08B 13/1427 340/539.11 |
| 2002/0141597 | A1 * | 10/2002 | Wilcock | G06F 3/167 381/61 |
| 2009/0264161 | A1 * | 10/2009 | Usher | H04M 1/22 455/570 |
| 2012/0071997 | A1 * | 3/2012 | Aliakseyeu | G08G 1/0965 700/94 |
| 2013/0182865 | A1 * | 7/2013 | Paul | G10K 11/178 381/71.8 |
| 2013/0238341 | A1 * | 9/2013 | You | G10L 25/48 704/275 |
| 2014/0044269 | A1 * | 2/2014 | Anderson | H04R 5/04 381/57 |
| 2014/0185828 | A1 * | 7/2014 | Helbling | H03G 5/165 381/103 |
| 2014/0314245 | A1 * | 10/2014 | Asada | H04R 1/1083 381/71.6 |
| 2014/0341399 | A1 * | 11/2014 | Dusse | H04R 5/04 381/150 |
| 2015/0171813 | A1 * | 6/2015 | Ganatra | H03G 3/24 381/57 |

(Continued)

*Primary Examiner* — Vivian Chin
*Assistant Examiner* — Ubachukwu Odunukwe

(57) ABSTRACT

Systems, methods, and computer hardware storage media are provided for variably reducing, but not eliminating, the ambient volume that reaches the eardrum in a particular setting. One or more noise signatures of sound from an ambient environment are received at a mobile device. A profile associated with a suppression or amplification control of the one or more noise signatures of sound from the ambient environment are created and stored at the mobile device. The suppression or amplification control is communicated from the mobile device to a set of variable audio ear plugs. The suppression control causes the variable audio ear plugs to variably reduce, but not eliminate, the sound from the ambient environment and the amplification control does not amplify sound from any source other than the ambient environment.

20 Claims, 3 Drawing Sheets

(56) References Cited

U.S. PATENT DOCUMENTS

2015/0222977 A1* 8/2015 Angel, Jr. .............. H04R 1/105
  381/74
2015/0281829 A1* 10/2015 Gauger, Jr. .......... H04R 1/1083
  381/71.6

* cited by examiner

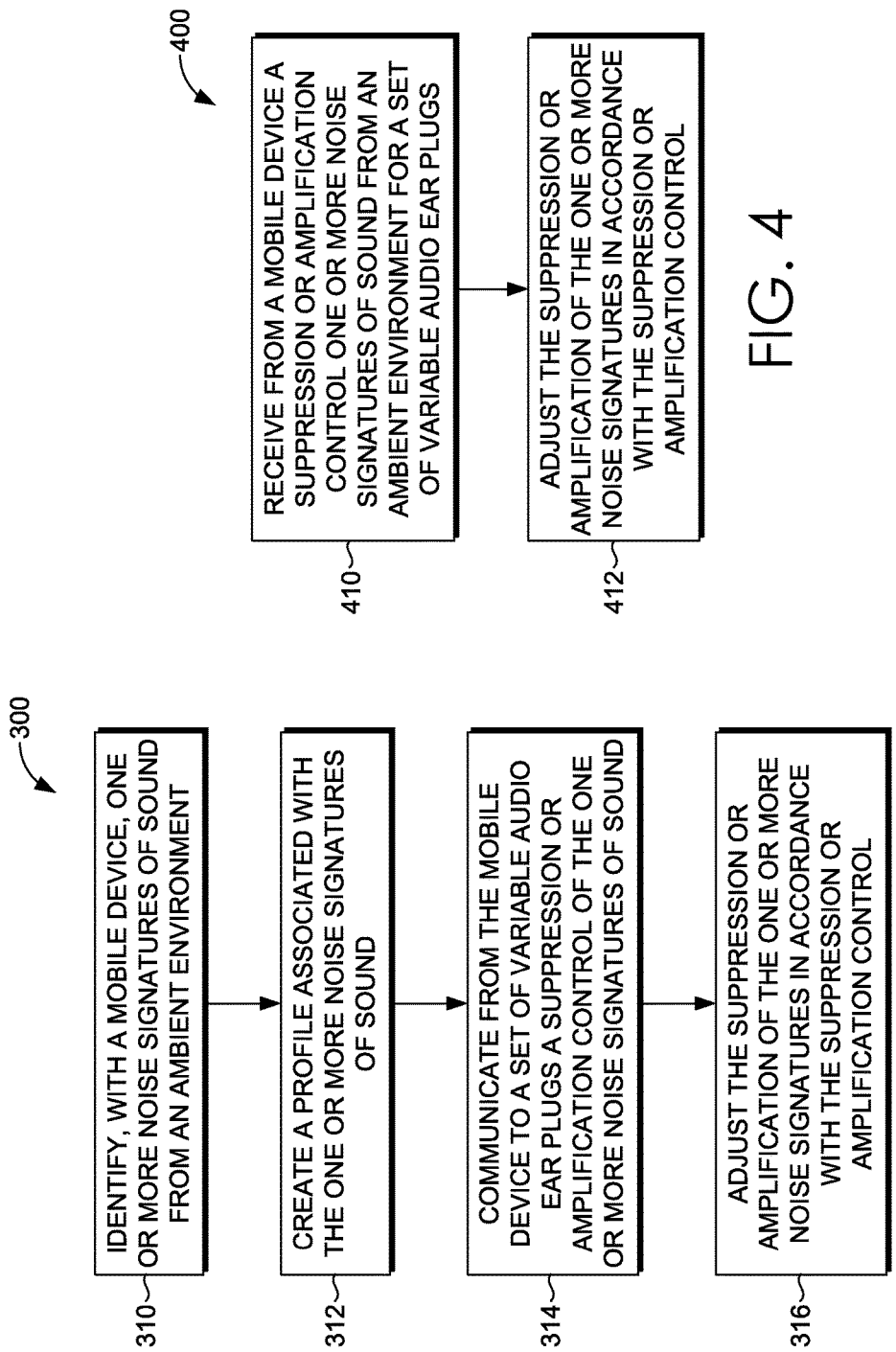

APPLICATION CONTROLLED VARIABLE AUDIO EAR PLUGS

SUMMARY

A high level overview of various aspects of the invention is provided here for that reason, to provide an overview of the disclosure and to introduce a selection of concepts that are further described below in the detailed-description section. This summary is not intended to identify key features or essential features of the claimed subject matter, nor is it intended to be used as an aid in isolation to determine the scope of the claimed subject matter.

In brief, and at a high level, this disclosure describes, among other things, systems, methods, and computer hardware storage media for variably reducing, but not eliminating, the ambient volume that reaches the eardrum in a particular setting. In embodiments, one or more noise signatures of sound from an ambient environment are received at a mobile device. A profile associated with a suppression or amplification control of the one or more noise signatures of sound from the ambient environment are created and stored at the mobile device. The suppression or amplification control is communicated from the mobile device to a set of variable audio ear plugs. The suppression control causes the variable audio ear plugs to variably reduce, but not eliminate, the sound from the ambient environment and the amplification control does not amplify sound from any source other than the ambient environment.

BRIEF DESCRIPTION OF THE DRAWINGS

Illustrative embodiments of the present invention are described in detail below with reference to the attached drawing figures, and wherein:

FIG. 3 is a flow diagram depicting an illustrative method of controlling variable audio ear plugs via an application, in accordance with embodiments of the invention; and FIG. 4 is a flow diagram depicting an illustrative method for controlling variable audio ear plugs, in accordance with embodiments of the invention.

DETAILED DESCRIPTION

Figure 1:
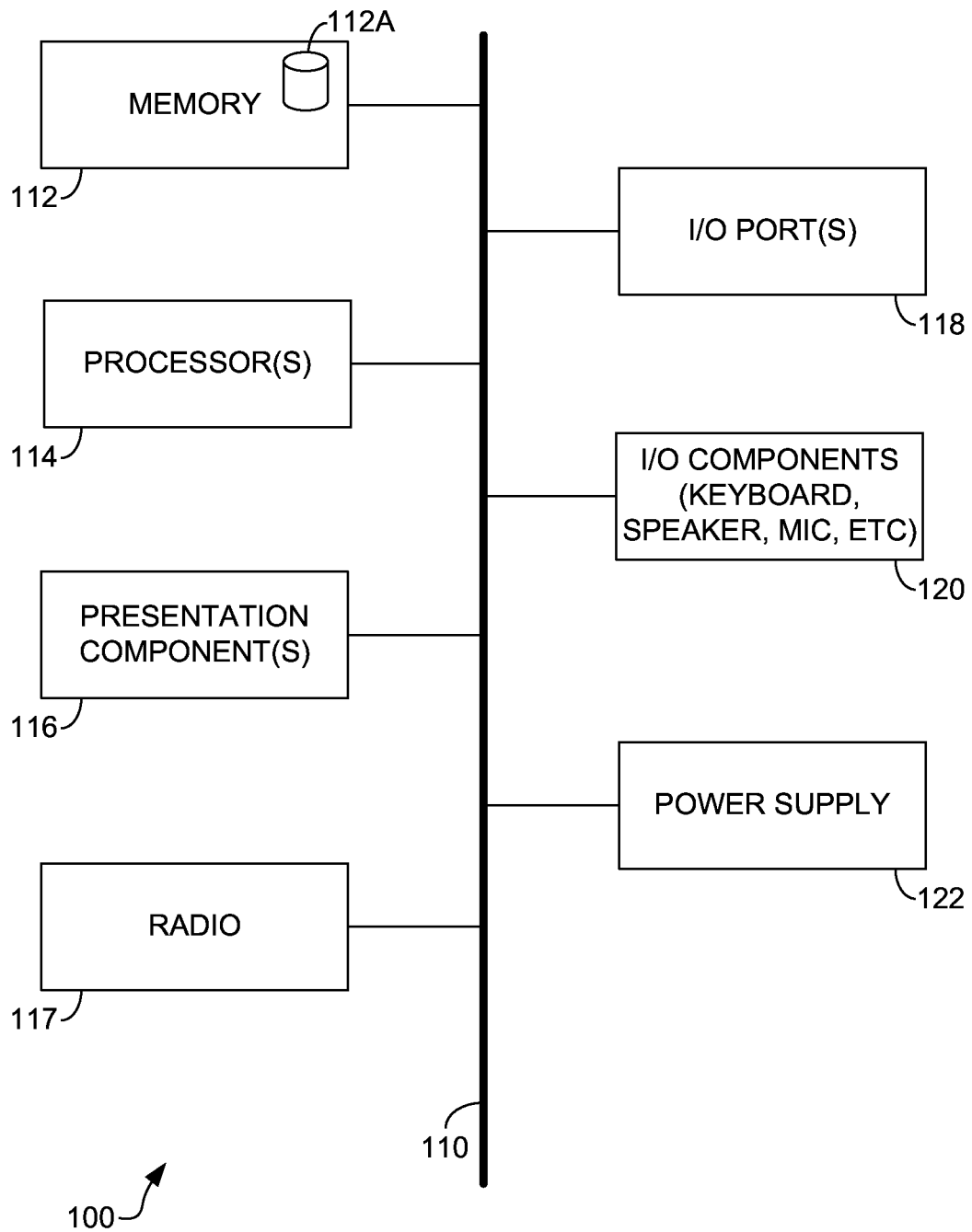
FIG. 1 depicts an illustrative device suitable for use in connection with embodiments of the invention.

The subject matter of select embodiments of the present invention is described with specificity herein to meet statutory requirements. But the description itself is not intended to define what we regard as our invention, which is what the claims do. The claimed subject matter might be embodied in other ways to include different steps or combinations of steps similar to the ones described in this document, in conjunction with other present or future technologies. Terms should not be interpreted as implying any particular order among or between various steps herein disclosed unless and except when the order of individual steps is explicitly described.

Many sounds exist in the ambient environment. At least a portion of these noise signatures that comprise the sound in the ambient environment may at times be distracting. In other instances, at least a portion of these noise signatures are important to the user and the user may wish to exclude other noise signatures or amplify the desired noise signatures. Noise cancelling headphones suppress all sound in the ambient environment but do not allow the user to only remove particular noise signatures selected by the user, such as via an application on a mobile device. Similarly, hearing aids allow a user to amplify sounds existing in the ambient environment but do not allow the user to amplify only particular noise signatures selected by the user.

Embodiments of the present invention modulate ambient noise to a desired level with desired characteristics from an interface on a mobile device. Embodiments of the present invention are directed to controlling the level of ambient audio that is allowed to pass through ear plugs to the eardrum. For clarity, ear plugs may include ear plugs, ear phones, over-the-ear cuff-style headsets, audio earpieces, and the like. Noise signatures that make up the ambient audio in the ambient environment may be utilized to create a profile. The profile may include a suppression or amplification control of the noise signatures. Suppression or amplification of the noise signatures may be adjusted in a set of variable audio ear plugs in accordance with the suppression or amplification control.

Accordingly, in one aspect, one or more computer hardware storage media having computer-executable instructions embodied thereon that, when executed by one or more computing devices, cause the one or more computing devices to perform a method of controlling variable audio ear plugs via an application are provided. The method comprises: identifying, with a mobile device, one or more noise signatures of sound from an ambient environment; creating a profile associated with the one or more noise signatures of sound; communicating from the mobile device to a set of variable audio ear plugs a suppression or amplification control of the one or more noise signatures of sound, wherein the suppression or amplification control is based on the profile; adjusting the suppression or amplification of the one or more noise signatures in accordance with the suppression or amplification control; wherein the suppression control causes the variable audio ear plugs to variably reduce, but not eliminate, the sound from the ambient environment, and further wherein the amplification control does not amplify audio from any source other than the ambient environment.

In another aspect, embodiments of the present invention are directed to a computer system for controlling variable audio ear plugs via an application. The computer system comprises a processor coupled to a computer hardware storage medium, the computer hardware storage medium having stored thereon a plurality of computer software components executable by the processor. The computer software components comprise: a noise component that receives one or more noise signatures of sound from an ambient environment; a profile component that stores a profile associated with a suppression or amplification control of the one or more noise signatures of sound from the ambient environment; and a control component that communicates, to a set of variable audio ear plugs, the suppression or amplification control; wherein the suppression control causes the variable audio ear plugs to variably reduce, but not eliminate, the sound from the ambient environment, and further wherein the amplification control does not amplify audio from any source other than the ambient environment.

In yet another aspect, embodiments of the present invention are directed to a method for controlling variable audio ear plugs. The method comprises: receiving from a mobile device a suppression or amplification control of one or more noise signatures of sound from an ambient environment for a set of variable audio ear plugs; adjusting the suppression or amplification of the one or more noise signatures in accordance with the suppression or amplification control; wherein the variable audio ear plugs variably reduce, but do not eliminate, the sound from the ambient environment, and further wherein the variable audio ear plugs do not communicate audio from any source other than the ambient environment.

Throughout this disclosure, several acronyms and shorthand notations are used to aid the understanding of certain concepts pertaining to the associated system and services. These acronyms and shorthand notations are intended to help provide an easy methodology of communicating the ideas expressed herein and are not meant to limit the scope of the present invention. The following is a list of these acronyms:

3G Third-Generation Wireless Telephone Technology
4G Fourth-Generation Wireless Telephone Technology
CDMA Code Division Multiple Access
CD-ROM Compact Disk Read Only Memory
CRM Customer Relations Management
DVD Digital Versatile Discs
EEPROM Electrically Erasable Programmable Read Only Memory
GPRS General Packet Radio Service
GPS Global Positioning System
GSM Global System for Mobile Communications
HLR Home Location Register
iDEN Integrated Digital Enhanced Network
MSC Mobile Serving Center
MMS Multimedia Messaging Service
PC Personal Computer
PCS Personal Communications Service
PDA Personal Digital Assistant
RAM Random Access Memory
RF Radio Frequency
ROM Read Only Memory
SLA Service Level Agreement
SMS Short Message Service
TDMA Time Division Multiple Access
UMTS Universal Mobile Telecommunications Systems
VoIP Voice over IP
Wi-Fi Wireless Fidelity
WiMAX Worldwide Interoperability for Microwave Access Further, various technical terms are used throughout this description. An illustrative resource that fleshes out various aspects of these terms can be found in Newton's Telecom Dictionary, 27th Edition (2012).

Embodiments of our technology may be embodied as, among other things, a method, system, or computer-program product. Accordingly, the embodiments may take the form of a hardware embodiment, or an embodiment combining software and hardware. In one embodiment, the present invention takes the form of a computer-program product that includes computer-useable instructions embodied on one or more computer-readable media.

Computer-readable media include both volatile and nonvolatile media, removable and nonremovable media, and contemplate media readable by a database, a switch, and various other network devices. Network switches, routers, and related components are conventional in nature, as are means of communicating with the same. By way of example, and not limitation, computer-readable media comprise computer-storage media and communications media.

Computer-storage media, or machine-readable media, include media implemented in any method or technology for storing information. Examples of stored information include computer-useable instructions, data structures, program modules, and other data representations. Computer-storage media include, but are not limited to RAM, ROM, EEPROM, flash memory or other memory technology, CD-ROM, digital versatile discs (DVD), holographic media or other optical disc storage, magnetic cassettes, magnetic tape, magnetic disk storage, and other magnetic storage devices. These memory components can store data momentarily, temporarily, or permanently.

Communications media typically store computer-useable instructions—including data structures and program modules—in a modulated data signal. The term "modulated data signal" refers to a propagated signal that has one or more of its characteristics set or changed to encode information in the signal. Communications media include any information-delivery media. By way of example but not limitation, communications media include wired media, such as a wired network or direct-wired connection, and wireless media such as acoustic, infrared, radio, microwave, spread-spectrum, and other wireless media technologies. Combinations of the above are included within the scope of computer-readable media.

Referring to the drawings in general, and initially to FIG. 1 in particular, a block diagram of an illustrative communications device according to one embodiment is provided and referenced generally by the numeral 100. Although some components are shown in the singular, they may be plural. For example, communications device 100 might include multiple processors or multiple radios, etc. As illustratively shown, communications device 100 includes a bus 110 that directly or indirectly couples various components together including memory 112, a processor 114, a presentation component 116, a radio 117, input/output ports 118, input/output components 120, and a power supply 122.

Memory 112 might take the form of memory components previously described. Thus, further elaboration will not be provided here, only to say that memory component 112 can include any type of medium that is capable of storing information (e.g., a database). A database can be any collection of records. In one embodiment, memory 112 includes a set of embodied computer-executable instructions 112A that, when executed, facilitate various aspects disclosed herein. These embodied instructions will variously be referred to as "instructions" or an "application" for short.

Processor 114 might actually be multiple processors that receive instructions and process them accordingly. Presentation component 116 includes the likes of a display, a speaker, as well as other components that can present information (such as a lamp (LED), or even lighted keyboards).

Radio 117 represents a radio(s) that facilitates communication with a wireless-telecommunications network. Illustrative wireless telecommunications technologies include CDMA, GPRS, TDMA, GSM, WiMax, LTE, and the like. In some embodiments, radio 117 might also facilitate other types of wireless communications including Wi-Fi communications and GIS communications. As can be appreciated, in various embodiments, radio 117 can be configured to support multiple technologies and/or multiple radios can be utilized to support a technology or multiple technologies.

Input/output port 118 might take on a variety of forms. Illustrative input/output ports include a USB jack, stereo jack, infrared port, proprietary communications ports, and the like. Input/output components 120 include items such as keyboards, microphones, speakers, touch screens, and any other item usable to directly or indirectly input data into communications device 100. Power supply 122 includes items such as batteries, fuel cells, or any other component that can act as a power source to power communications device 100.

The communications device 100 can be any electronic device having radio frequency capabilities, that is, a device capable of emitting or receiving an RF signal. The mobile device may take on a variety of forms, such as a personal computer (PC), a laptop computer, a mobile phone, a personal digital assistant (PDA), or any other device that utilizes RF services as described herein.

Figure 2:
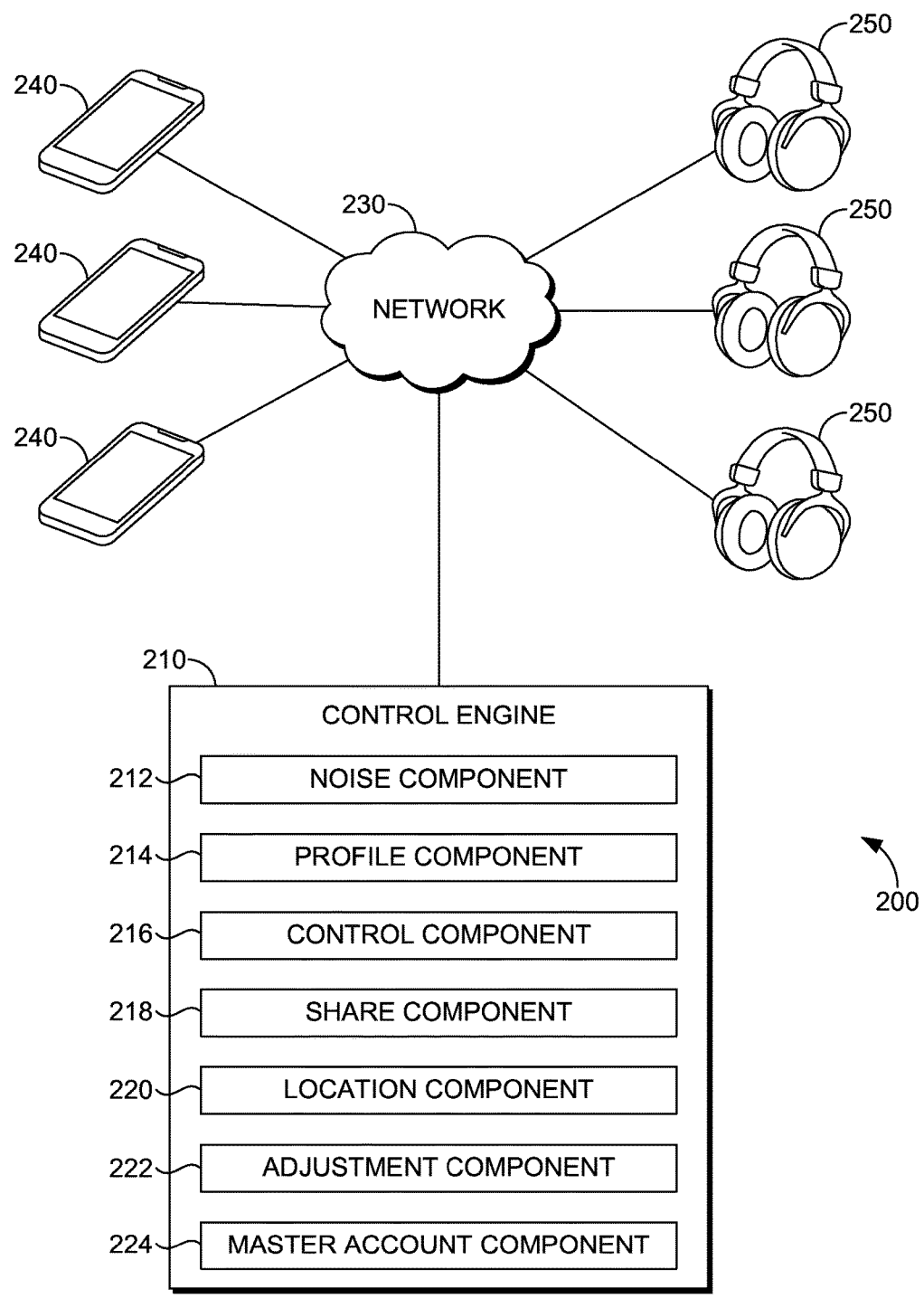
FIG. 2 depicts a schematic view of an exemplary network environment suitable for performing embodiments of the invention.

Turning now to FIG. 2, an exemplary network environment suitable for use in implementing embodiments of the present invention is illustrated and designated generally as environment 200. Environment 200 is but one example of a suitable environment and is not intended to suggest any limitation as to the scope of use or functionality of the invention. Neither should the environment be interpreted as having any dependency or requirement relating to any one or combination of components illustrated.

In the environment 200, network 230 enables communication between control engine 210, user devices 240 (e.g., mobile devices, servers, a personal computers, etc.), and variable audio ear plugs 250 (e.g., ear plugs, headphones, and the like). User devices 222 may take on a variety of forms, such as a personal computer (PC), a laptop computer, a tablet, a netbook, a mobile phone, a Smart phone, a personal digital assistant (PDA), or any other device that is cable of communicating with other devices. For example, the user device can take on any form, such as a mobile device or any other computing device capable of wirelessly communicating with the other devices using the network 210. Makers of illustrative devices include, for example, Research in Motion, Creative Technologies Corp., Samsung, Apple Inc., and the like. A device can include, for example, a display(s), a power source(s) (e.g., a battery), a data store(s), a speaker(s), memory, a buffer(s), and the like. In embodiments, a user device comprises a wireless or mobile device with which a wireless telecommunication network(s) can be utilized for communication (e.g., voice and/or data communication). In this regard, the user device can be any mobile computing device that communicates by way of, for example, a 3G or 4G network.

In embodiments, the network 210 is a telecommunications network(s), or a portion thereof. A telecommunications network might include an array of devices or components, some of which are not shown so as to not obscure more relevant aspects of the invention. Components such as terminals, links, and nodes (as well as other components) can provide connectivity in some embodiments. Network 210 can include multiple networks, as well as being a network of networks, but is shown in more simple form so as to not obscure other aspects of the present invention. The network 210 can be part of a telecommunication network that connects subscribers to their immediate service provider. In embodiments, the network 210 can be associated with a telecommunications provider that provides services to user devices. For example, the network 210 may provide voice services to user devices or corresponding users that are registered or subscribed to utilize the services (e.g., the network 210) provided by a telecommunications provider. The network 210 can be any communication network providing voice and/or data service(s), such as, for example, a 1× circuit voice, a 3G network (e.g., CDMA, CDMA2000, WCDMA, GSM, UMTS), or a 4G network (WiMAX, LTE, HSDPA).

Control engine 210 is utilized to control the suppression or amplification of various noise signatures of sound from the ambient environment, without adding any noise signatures originating from any source other than the ambient environment. For clarity, a noise signature may represent a repeating series of frequencies or wavelengths of sound or a specific pattern of frequencies or wavelengths of sound or a specific measurable change in frequencies or wavelength of sound or simply a specific frequency or wavelength of sound. Additionally, a noise signature may represent a repeating series of changes in amplitude or volume of sound or a specific pattern of changes in amplitude or volume of sound or a specific measurable change in amplitude or volume of sound or simply a specific amplitude or volume of sound. Further, a noise signature may be defined as any combination of the aforementioned signatures defined by frequency or wavelength of sound and amplitude or volume of sound. The control engine 210 includes, in various embodiments, noise component 212, profile component 214, control component 216, share component 218, location component 220, adjustment component 222, and master account component 224. Although each of these components are illustrated as one control engine 210 associated with the network 230, it should be appreciated that any or all of these components may be associated with any of the network elements, including user devices 240 or variable audio ear plugs 250.

Noise component 212 receives one or more noise signatures of sound from an ambient environment. In one embodiment, the noise signatures are received from mobile device 240. In another embodiment, the noise signatures are received from a master account. In another embodiment, the noise signatures are associated with a profile (e.g., concert setting) or a location (i.e., where the particular noise signatures to amplify or suppress may already be defined by a profile). For example, a user may be at a concert or other venue where at least a portion of the sound from the ambient environment is desired to be amplified or suppressed. The user may use an interface on the mobile device 240 to select the desired noise signature to amplify or suppress. In this regard, the mobile device 240 acts as an equalizer that controls the sound in the ambient environment (e.g., particular wavelengths or frequencies as well as volume) that reaches the ear drum of the user via the ear plugs.

Profile component 214 stores a profile associated with a suppression or amplification control of the one or more noise signatures of sound from the ambient environment. The profile may allow the user to control the sound from the ambient environment that reaches the ear drum of the user via the ear plugs 250 in a frequently or commonly visited setting. For example, the user may attend conferences in a room that has a loud air conditioner that distracts the user from hearing a particular presentation. The user may place the mobile device 240 near the offending signature of sound and create and store a profile for that noise signature. The profile may include a suppression or amplification control to suppress the offending noise signature and/or amplify the desired noise signature. The profile may be based on particular setting, venue, location, or may be based on a particular noise signature (e.g., road noise in a car, voices, music, and the like). Similarly, the profile may be based on a particular user (e.g., a child). For example, a parent may want to limit the volume in an ambient environment that reaches the ear drum of a child wearing ear plugs 250. The parent may create a profile that limits the overall volume by suppressing (or otherwise controlling), but not eliminating, one or more noise signatures of sound in the ambient environment.

Control component 216 communicates, to a set of variable audio ear plugs 250, the suppression or amplification control. The suppression or amplification control allows the user to control from the mobile device 240 what sound in the ambient environment ultimately reaches the ear drum of the user via the ear plugs 250. The suppression or amplification control does not add any additional noise signatures that are not part of the ambient environment. In other words, the suppression or amplification control only modulates noise signatures that are part of and originate from the ambient environment.

In one embodiment, share component 218 shares the profile with one or more mobile devices associated with one or more sets of variable audio ear plugs. For example, a user may have identified a particular noise signature in the ambient environment that is desirable to suppress or amplify. The user may share that particular noise signature and the associated suppression or amplification control with other users via the profile so the other users may readily communicate the control to their ear plugs 250 as well.

In one embodiment, location component 220 identifies a location associated with a mobile device and determines the profile associated with that location. This location awareness allows the mobile device 240 to automatically communicate the appropriate control to the ear plugs 250 for that location. For example, a worksite may have sounds in the ambient environment that are a nuisance to workers. When a worker arrives at the worksite, the location component 220 identifies the mobile device 240 is in that location and determines the appropriate profile allowing the mobile device 240 to communicate the appropriate control to the user's ear plugs 250. Similarly, the location component 220 may identify when the mobile device 240 is paired to another device (e.g., via Bluetooth) as described herein.

In one embodiment, adjustment component 222 adjusts the suppression or amplification of the one or more noise signatures in accordance with the suppression or amplification control. More particularly, the suppression control causes the variable audio ear plugs 250 to variably reduce, but not eliminate, the sound from the ambient environment. Further the amplification control does not amplify audio from any source other than the ambient environment. Stated another way, the ear plugs 250 only allow sound to pass through the ear plugs to the ear drums of the user that exist in the current ambient environment. The mobile device 240 is communicating controls that only modulate ambient sound and do not add sound from any other source.

In one embodiment, master account component 224 identifies one or more sets of variable audio ear plugs 250 associated with a master account. Master account component 224 then determines the profiles to associate with each set of variable audio ear plugs 250. Finally, master account component 224 instructs the control component 216 when to communicate a suppression or amplification control. For example, a parent may create a master account to control an overall volume that reaches the ear drum of a child via ear plugs 250. Similarly, the parent may create a profile for the child in certain locations or settings. Master account component 224 identifies the ear plugs associated with the master account and determines which profile should be associated with each set of ear plugs 250. When the ear plugs 250 are being utilized in a particular location or setting (such as may be determined by a mobile device associated with the child), master account component 224 instructs control component 216 to communicate the associated suppression or amplification control to the ear plugs 250.

Turning now to FIG. 3, a flow diagram of an illustrative method of controlling variable audio ear plugs via an application, in accordance with embodiments of the invention, is depicted. Initially, at step 310, one or more noise signatures of sound from an ambient environment are identified with a mobile device. The mobile device may identify the one or more noise signatures by being exposed to the noise signatures.

The profile associated with the one or more noise signatures of sound is created, at step 312. In one embodiment, the profile is based on a location of the mobile device. For example, a particular location may be associated with a noise signature that is common at that location. In one embodiment, the profile is based on a user associated with the variable audio ear plugs. For example, a parent may create a profile for a child to limit the overall volume of sound that reaches the ear drums of the child. In one embodiment, the profile is based on a noise signature recorded or saved by the mobile device. For example, a user may identify the source of a noise signature that is desired to be amplified or suppressed. The user may move the mobile device near that source and record or save the noise signature to the mobile device so the noise signature can later be used as a trigger and definition of sound to be amplified or suppressed.

At step 314, a suppression or amplification control of the one or more noise signatures of sound is communicated from the mobile device to a set of variable audio ear plugs. The suppression or amplification control is based on the profile. In other words, the profile associates the noise signature with the appropriate suppression or amplification control. In one embodiment, the suppression or amplification control is communicated from an application associated with a master account. For example, a parent may set up a master account to limit the absolute or maximum volume that reaches the ear drums of a child via the ear plugs. The master account may further allow the parent to control specific sounds the child is exposed to. In one embodiment, the suppression or amplification control is communicated from an application running on the mobile device.

In one embodiment, the user may already have a profile associated with a particular noise signature stored on a mobile device. The mobile device may determine that a particular noise signature in the ambient environment matches the profile. In this example, the mobile device may automatically communicate the suppression or amplification control associated with that profile. Such profiles associated with the one or more noise signatures may be shared with other users or other mobile devices (e.g., via the application running on the mobile device). In one embodiment, a suppression or amplification control shared by a sharing device, is received at the mobile device. In this example, the suppression or amplification control originates with the sharing device. This may allow one user who has already identified a particular noise signature in a particular setting to create and share the profile that allows other users to communicate the associated suppression or amplification control to their ear plugs.

In one embodiment, an indication is received that the mobile device has paired with another device. For example, a worker that operates loud machinery may desire to hear the sound in the ambient environment without hearing the sounds associated with the loud machinery. A profile may have been created that defines a suppression or amplification control for the noise signatures associated with the machinery or a particular location or worksite. When the mobile device of the worker pairs with the machinery, the indication is received allowing the appropriate suppression or amplification control to be communicated to the ear plugs of the user.

At step 316, the suppression or amplification of the one or more noise signatures is adjusted in accordance with the suppression or amplification control. The suppression control causes the variable audio ear plugs to variably reduce, but not eliminate, the sound from the ambient environment. The amplification control does not amplify audio from any source other than the ambient environment. As can be appreciated, such a suppression or amplification may allow a user to remove nuisance sounds or amplify desired sounds in the ambient environment. Such suppression may allow a user to variably reduce sounds such as road noise, worksite noise, machinery noise, or other distractions such as snoring, crying, and the like without eliminating the sound from the ambient environment. Similarly, such amplification may allow the user to increase the focus of desired sounds in the ambient environment.

FIG. 4 depicts a flow diagram of an illustrative method for controlling variable audio ear plugs, in accordance with embodiments of the invention. Initially, at step 410, a suppression or amplification control of one or more noise signatures from an ambient environment for a set of variable audio ear plugs is received from an application running on a mobile device. In one embodiment, the control is received via a web service. In one embodiment, the suppression or amplification control is received when the mobile device is paired with another device. The suppression or amplification control may be associated with a profile. The suppression or amplification control may be associated with a location. In one embodiment, the suppression control of a noise signature is automatically created by placing the mobile device near the source of the noise signature.

At step 412, the suppression or amplification of the one or more noises signatures is adjusted in accordance with the suppression or amplification control. The suppression control causes the variable audio ear plugs to variably reduce, but not eliminate the sound from the ambient environment. The amplification control does not cause the variable audio ear plugs to communicate audio from any source other than the ambient environment.

Many different arrangements of the various components depicted, as well as components not shown, are possible without departing from the scope of the claims below. Embodiments of our technology have been described with the intent to be illustrative rather than restrictive. Alternative embodiments will become apparent to readers of this disclosure after and because of reading it. Alternative means of implementing the aforementioned can be completed without departing from the scope of the claims below. Certain features and subcombinations are of utility and may be employed without reference to other features and subcombinations and are contemplated within the scope of the claims.

What is claimed is:

1. One or more non-transitory computer hardware storage media having computer-executable instructions embodied thereon that, when executed by one or more computing devices, cause the one or more computing devices to perform a method of controlling variable audio ear plugs via an application, the method comprising:

identifying, with a first mobile device, one or more noise signatures of sound waves from an ambient environment;

receiving an identification of at least one noise signature of the one or more noise signatures that is to be amplified;

creating a profile associated with the at least one noise signature of the sound waves from the ambient environment;

receiving a modulation control for the profile associated with at least one noise signature of the one or more noise signatures, wherein the modulation control dictates a volume of the sound waves associated with the at least one noise signature originating from the ambient environment that reach a user via the variable audio ear plugs upon communication thereof;

communicating, by the variable audio ear plugs, the sound waves from the ambient environment with the modulation control for the profile associated with at least one noise signature, such that amplification of the profile associated with at least the portion of the one or more noise signatures does not exceed a decibel level of the ambient environment;

updating the profile associated with the at least one noise signature of the one or more noise signatures; and generating, by the variable audio ear plugs, sound waves matching the profile associated with the at least one signature.

2. The media of claim 1, wherein the modulation control is amplification control that is communicated from an application associated with a master account.

3. The media of claim 1, wherein the modulation control is communicated from an application running on the first mobile device.

4. The media of claim 3, wherein the method further comprises receiving an indication that the first mobile device has paired with a second mobile device.

5. The media of claim 4, wherein the method further comprises receiving, at the second mobile device, the updated profile.

6. The media of claim 1, wherein the profile is associated with a location of the first mobile device.

7. The media of claim 1, wherein the profile is associated with a user.

8. The media of claim 1, wherein the profile is based on a noise signature of sound recorded or saved by the first mobile device.

9. The media of claim 1, wherein the method further comprises determining a noise signature of sound from the ambient environment matches the profile.

10. The media of claim 1, wherein the method further comprises sharing the updated profile with one or more users.

11. A computer system for controlling variable audio ear plugs via an application, the computer system comprising:
one or more processors; and
one or more computer storage media storing computer-useable instructions that, when executed by the one or more processors, implement a method comprising:
receiving, by a mobile device, one or more noise signatures of sound waves from an ambient environment;
receiving, via an interface on the mobile device, an identification of a particular noise signature of the one or more noise signatures that is to be amplified;
creating a profile associated with the particular noise signature of the one or more signatures;
receiving, via the interface on the mobile device, a first amplification control of the profile associated with the particular noise signature of the one or more noise signatures, wherein the first amplification control dictates a volume of sound waves associated with the particular noise signature transmitted via at least one set of a plurality of variable audio ear plugs;

communicating, by the at least one set of variable audio ear plugs, the sound waves from the ambient environment with the first amplification control of the profile associated with the particular noise signature, such that amplification of the profile associated with at least the portion of the one or more noise signatures does not exceed a decibel level of the ambient environment; and communicating the profile associated with the particular noise signature to the plurality of variable audio ear plugs associated with the mobile device.

12. The system of claim 11, wherein the method further comprises sharing the profile with one or more mobile devices associated with one or more sets of variable audio ear plugs.

13. The system of claim 11, wherein the method further comprises identifying a location associated with the mobile device and associating the profile with that location.

14. The system of claim 13, wherein the method further comprises adjusting the amplification of the particular noise signature of sound in accordance with a second amplification control.

15. The system of claim 11, wherein the method further comprises identifying one or more sets of variable audio ear plugs associated with a master account.

16. A method for controlling variable audio ear plugs comprising:
receiving an identification of at least a portion of one or more noise signatures that are to be amplified;
creating a profile associated with at least the portion of the one or more noise signatures that are to be amplified;
receiving, from a mobile device, amplification control for the profile associated with the portion one or more noise signatures of sound from an ambient environment for variable audio ear plugs, wherein the amplification control dictates a volume of sound waves associated with the at least the portion of the one or more noise signatures of sound from the ambient environment that reach a user via the variable audio ear plugs;
adjusting amplification of the profile associated with at least the portion of the one or more noise signatures of sound in accordance with the amplification control and communicating the adjusted amplification to the variable audio ear plugs; and
communicating, by the variable audio ear plugs, the sound waves from the ambient environment with the modulation control for the at least one noise signature, such that amplification of the profile associated with at least the portion of the one or more noise signatures does not exceed a decibel level of the ambient environment.

17. The method of claim 16, further comprising associating the amplification control with a profile.

18. The method of claim 17, further comprising automatically creating a suppression control of a noise signature of sound by placing the mobile device near the source of the noise signature of sound.

19. The method of claim 16, further comprising associating the amplification control with a location.

20. The method of claim 16, further comprising receiving the amplification control when the mobile device is paired with another device.

* * * * *